United States Patent [19]

Peczalski et al.

[11] Patent Number: 5,298,772
[45] Date of Patent: Mar. 29, 1994

[54] INTEGRATED HETEROSTRUCTURE ACOUSTIC CHARGE TRANSPORT (HACT) AND HETEROSTRUCTURE INSULATED GATE FIELD EFFECTS TRANSISTOR (HIGFET) DEVICES

[75] Inventors: Andrzej Peczalski, Eden Prairie; David E. Grider; James F. Detry, both of Bloomington; George A. Kilgore, Long Lake, all of Minn.; William J. Tanski, Glastonbury, Conn.; Thomas W. Grudkowski, Glastonbury, Conn.; Robert N. Sacks, Glastonbury, Conn.

[73] Assignee: Honeywell Inc., Minneapolis, Minn.

[21] Appl. No.: 843,470

[22] Filed: Feb. 28, 1992

[51] Int. Cl.$^5$ .................... H01L 41/08; H01L 29/84
[52] U.S. Cl. .................... 257/195; 257/245; 257/416; 310/313 B
[58] Field of Search ............ 257/195, 192, 245, 183.1, 257/416; 310/313 B, 313 R

[56] References Cited

U.S. PATENT DOCUMENTS

| | | | |
|---|---|---|---|
| 4,633,285 | 12/1986 | Hunsinger et al. | 257/222 |
| 4,814,851 | 3/1989 | Abrokwah et al. | 257/192 |
| 4,884,001 | 11/1989 | Sacks et al. | 310/313 A |
| 4,893,161 | 2/1991 | Tanski et al. | 310/313 R |
| 4,926,083 | 5/1990 | Merritt et al. | 310/313 R |
| 4,980,596 | 12/1990 | Sacks et al. | 310/313 D |
| 4,990,814 | 1/1990 | Tanski et al. | 257/183.1 |

FOREIGN PATENT DOCUMENTS 62-136080 6/1987 Japan .................... 257/195

OTHER PUBLICATIONS

Merritt, Sears W., "Heterostructure Acoustic Charge Transport Device Model", 1990 IEEE Ultrasonics Symposium, Dec. 5-7, 1990.

Cullen, Donald E., Thomas W. Grudkowski, Sears W. Merritt, William J. Tanski, Roger D. Carroll, Robert N. Sacks and Emilio J. Branciforte, "HACT Device Applications", 1990 IEEE Ultrasonics Symposium, Dec. 5-7, 1990.

Carroll, Roger D., Sears W. Merritt, Emilio J. Branciforte, William J. Tanski, Donald E. Cullen and Robert N. Sacks, "A Baseband Transversal Filter Using HACT Technology".

Merritt Sears W., William J. Tanski, Donald E. Cullen, Robert N. Sacks, Emilio J. Branciforte, Roger E. Carroll and Gerald A. Peterson, "Heterojunction Acoustic-Charge-Transport Fixed-Tap Transversal Filter", IEEE Electron Device Letters, vol. 11, No. 3, Mar. 1990.

Tanski, William J., Sears W. Merritt, Donald E. Cullen, Roger D. Carroll, Emilio J. Branciforte and Robert N. Sacks, and William D. Hunt, "Heterostructure Acoustic Charge Transport Technology for Programmable Transversal Filters".

Merritt, Sears W., William J. Tanski, Donald E. Cullen, Robert N. Sacks, Roger D. Carroll and Emilio J. Branciforte, "A 3.35 Microsecond HACT Transversal Filter", 1989 IEEE Ultrasonics Symposium, Oct. 3-6, 1989.

Tanski, W. J., R. N. Sacks, S. W. Merritt, D. E. Cullen, E. J. Branciforte, T. C. Eschrich, and R. D. Carroll, "Heterostructure Acoustic Charge Transport Device on MBE Grown BaAs/(Al,Ga)As Epitaxial Layers", 1989 MBE Workshop, Raleigh, N.C.

(List continued on next page.)

Primary Examiner—Rolf Hille
Assistant Examiner—Robert Limanek
Attorney, Agent, or Firm—John G. Shudy, Jr.

[57] ABSTRACT

A monolithic integrated circuit device combines integrated heterostructure acoustic charge transport (HACT) devices and heterostructure insulated gate field effect transistor (HIGFET) devices in a single structure in which the HACT and HIGFET layers are grown in as a contiguous composite heterostructure.

12 Claims, 4 Drawing Sheets

OTHER PUBLICATIONS

Cullen, D. E., W. J. Tanski, S. W. Merritt, R. N. Sacks, R. D. Carroll and E. J. Branciforte, "Heterojunction Acoustic Charge Transport Device Technology", 1988 Ultrasonics Symposium.

Tanski, William J., Sears W. Merritt, Robert N. Sacks, Donald E. Cullen, Emilio J. Branciforte, Roger D. Carroll and Timothy C. Eschrich, "Heterojunction acoustic charge transport devices on GaAs", Appl. Phys. Lett. 52(1), Jan. 4, 1988.

Tanski, William J., Donald E. Cullen, S. W. Merritt and R. N. Sacks, "GaAs Heterojunction Acoustic Charge Transport (HACT) Devices for Signal Processing Applications", 1988 GOMAC Conference, Las Vegas, Nev.

Sacks, R. N., W. J. Tanski, S. W. Merritt, D. E. Cullen, E. J. Branciforte and T. C. Eschrich, "Acoustic charge transport in an (Al, Ga)As/GaAs heterojunction structure grown by molecular-beam epitaxy", J. Vac. Sci. Technol. B 6(2), Mar./Apr. 1988.

Peterson, G. A., B. J. McCartin, W. J. Tanski and R. E. LaBarre, "Charge confinement in heterojunction acoustic charge transport devices", Appl. Phys. Lett. 55(13), Sep. 25, 1989.

INTEGRATED HETEROSTRUCTURE ACOUSTIC CHARGE TRANSPORT (HACT) AND HETEROSTRUCTURE INSULATED GATE FIELD EFFECTS TRANSISTOR (HIGFET) DEVICES

BACKGROUND OF THE INVENTION

I. Field of the Invention

The invention relates generally to electro-acoustic charge transport devices and, more particularly, to monolithic integrated circuit devices containing heterostructure acoustic charge transport (HACT) and heterostructure insulated gate field effect transistor (HIGFET) devices fabricated on a same substrate.

II. Discussion of the Related Art

Acoustic charge transport devices having a delay line using a surface acoustic wave (SAW) generating transducer to launch a series of acoustic waves through a layered piezoelectric semiconductor structure have been developed relatively recently. Such devices use an acoustic wave passing through the piezoelectric semiconductor to form a series of potential wells that transport packets of charge, together with the wave, along the semiconductor material. Further developments include improvements related to confining the mechanism within specific areas of the piezoelectric material such that the transport mechanism is confined to one or more discrete transport channel layers within the material so that the location of the charge packet can be more accurately defined for use.

Generally, in these devices, transducers are utilized for launching surface acoustic waves along a propagation axis. The waves are characterized by maxima and minima of electrical potential which can be used to transport electrical charge such as provided to it. A first input electrode is utilized to provide input electric charge to the surface acoustic waves by conduction to the transport channel. The surface acoustic waves are transported along the transport channel carrying the charge packets within, provided that there is lateral and vertical electric potential confinement, until the wave reaches a connection to an output electrode which receives the transported signals. In this manner, sampled input signals in the form of the electrical packets can be transported readily at predictable speed through the material.

One such device which uses heterostructure quantum wells to confine the charge packets to the discrete channels is illustrated and described in U.S. Pat. No. 4,893,161 to William J. Tanski, et al. Another device which incorporates a barrier transport channel made by forming a portion of a layer of piezoelectric semiconductor material between confining layers in which majority carriers are depleted from the channel and an electrical signal is thereafter injected into the channel such that a delayed version of the electrical signal which has been carried along by the surface acoustic wave can be extracted from the channel is illustrated and described in U.S. Pat. No. 4,633,285.

It is also known to provide a monolithic device having a heterostructure acoustic charge transport (HACT) device monolithically integrated with a modulation doped field effect transistor (MODFET) on the same substrate. Such a device is disclosed in U.S. Pat. No. 4,884,001 to Robert N. Sacks and William J. Tanski, co-inventors in the present application. That device is characterized by a sequence of epitaxial layers comprising the MODFET fabricated as the uppermost layers in a multi-layer heterostructure with the HACT device fabricated in a partially overlapping, adjacent section using layers beneath the level of the MODFET, after selected upper ones have been partially removed, to form a monolithic device.

In addition to MODFETs, there has been an effort to combine ion implanted metal semiconductor field effect transistors (MESFETs) with acoustic charge transfer devices built of $N^-$ epitaxial GaAs layers. These integrated devices do have a high operating frequency, however, they are not heterostructure devices, require relatively high power and have a relatively small dynamic range.

It is also known to fabricate heterostructure insulated gate field effect transistors (HIGFETs) on a common planar wafer surface (e.g., semi-insulating gallium arsenide (GaAs) wafer substrate) using known molecular beam epitaxy (MBE) techniques. Such a device is shown in U.S. Pat. No. 4,814,851 to Abrokwah, et al. In that system, the heterostructure used for the HIGFETs consists of an undoped GaAs buffer layer grown on the semi-insulating GaAs substrate followed by an undoped AlGaAs gate layer. This can be used to make both n- and p- channel HIGFETs which utilize the high mobility, two-dimensional (2 D) electron (hole) gas which is induced at the (AlGa)As-GaAs hetero-surface by the application of a suitable gate biased voltage. A self-aligned gate (SAG) process is used to form the source and drain regions of the transistors with $p^+$ implanted regions for the p-channel and $n^+$ implanted regions for n channel HIGFETs. Such devices are characterized by their low energy consumption, high processing yield and high circuit density.

Heretofore, it has not been possible to combine the distinct electronic advantages of compact HIGFET heterostructure design with HACT in an integrated HACT/HIGFET monolithic integrated circuit device. It would be quite advantageous if the HIGFET control electronics could be used to program and read out the HACT device in an integrated, monolithic IC structure. This would greatly enhance the signal processing capabilities of the HACT device and provide small, highly reliable devices with low pick-up noise.

SUMMARY OF THE INVENTION

The present invention provides an integrated HACT-/HIGFET monolithically integrated signal processing device characterized by an increased number of sense tap outputs, low power requirements, and a small size which allows for a dense, highly reliable system with very low pick-up noise. The HIGFET, of course, is used for the control electronics for programming the HACT for signal readout. This, for example, can include use as a correlator or Finite Impulse Response filter.

The invention combines multi-layer heterostructure technology in which the HACT layers, including the charge transport layer, are deposited using molecular beam epitaxy (MBE) on top of previously epitaxially grown HIGFET layers. The top layer of the HIGFET system is an etch stop layer and a portion of the HACT layers are etched away to form a mesa on the etch stop layer, which is normally GaAs and/or AlGaAs-GaAs, using highly selective etches. The HACT and HIGFET surface electronic devices are then processed on the respective HACT and HIGFET structures to form the monolithic circuit device.

BRIEF DESCRIPTION OF THE DRAWINGS

In the drawings, wherein like numerals are utilized to designate like parts throughout the same.

DETAILED DESCRIPTION

As was previously discussed, the drawbacks of prior acoustic charge transport devices include the relatively low number of sense tap outputs and relatively high power consumption. In addition, an increase in the dynamic range and reduction in the operating noise are sought after as desired characteristics. The following described embodiment exemplifies an integrated heterostructure acoustic charge transport (HACT) and heterostructure insulated gate field effect transistor (HIGFET) IC device contemplated by the invention but represents only one embodiment or form it may take.

Figure 3:
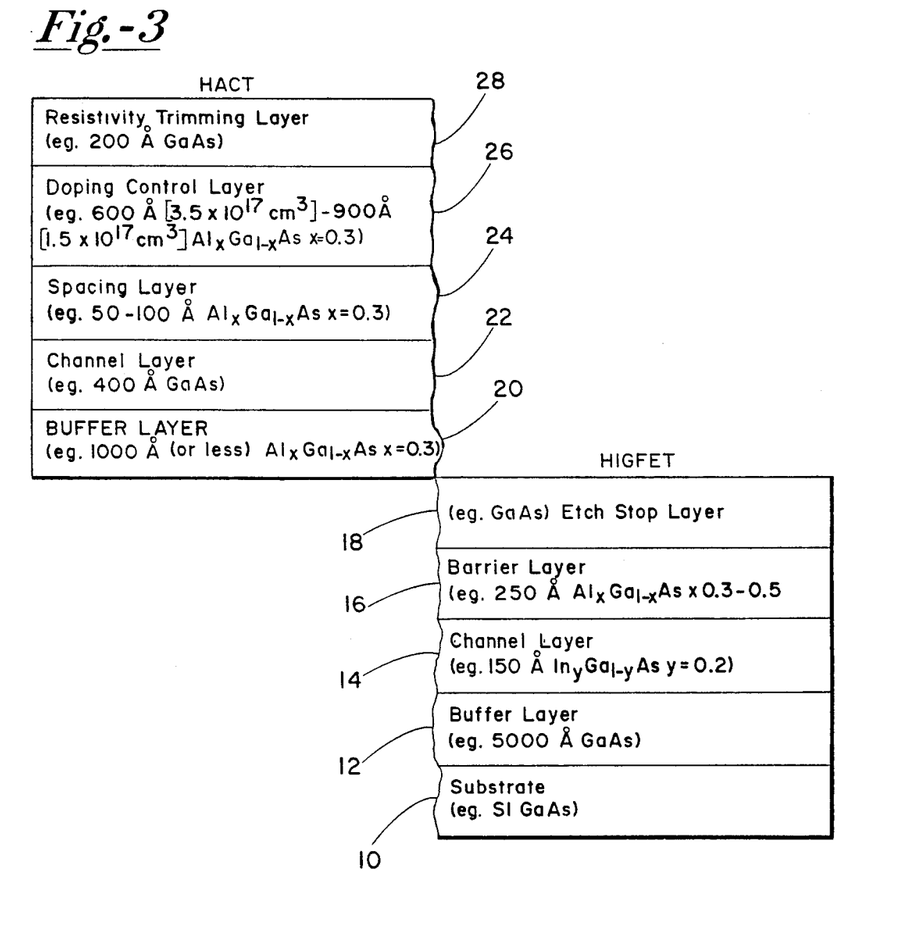
FIG. 3 is a cross-sectional schematic representation of a device constructed in accordance with the invention.

With respect to the combined device, the distinct layered heterostructure will first be described. In this regard, of the Figures, FIG. 3 depicts the layered structure of a preferred embodiment schematically and in cross-section to illustrate the details of the layered structure. The lower portion of the structure contains the layers of the HIGFET device, and the upper layers carry the HACT system in a mesa structure. The HIGFET portion includes a plurality of epitaxial layers 12, 14 and 16 grown on a semi-insulating gallium arsenide GaAs wafer substrate preferably using known molecular beam epitaxy (MBE) techniques. The first layer is a buffer layer which consists of, for example, a 5,000 Å thickness of pure, undoped GaAs which is grown under conditions to make it as close to intrinsic as possible. The second layer 14 is the channel or conduction layer for the HIGFETs and normally consists of a pure and undoped layer of InGaAs of the formula $In_yGa_{1-y}As$ wherein Y may equal approximately 0.2, and this layer is typically about 150 angstroms in thickness. The channel layer 14 is sandwiched between the buffer layer 12 below and a barrier layer 16 above which normally consists of a further epitaxial layer of AlGaAs of the formula $Al_xGa_{1-x}As$ wherein x is, for example, in the range 0.3 to 0.5. An additional layer, for example, a layer of GaAs 18 is grown on top of the barrier layer 16 to act as an etch stop layer to protect the lower layers, i.e., layer 16, etc., during further processing and etching away of the portions of the upper HACT layers.

The MBE grown heterostructure of the multi-layer barrier HACT portion is grown on top of the barrier and etch stop layers associated with the complementary HIGFET epitaxial layers and includes HACT layers 20, 22 and 24. In these layers, as is the case with layers 12-18, the growth conditions are adjusted to obtain as close to an intrinsic semiconductor material as possible with minimum total doping.

The layer 20 is generally a buffer layer for the HACT device which may be, for example, 1000 angstroms or less of $Al_xGa_{1-x}As$ (x=0.3), for example, the layer 22 is the channel layer or charge transport layer and is normally a layer of GaAs but may also be InGaAs or any other semiconductor material with the proper band structure and carrier transport properties. This is followed by a relatively thin upper trapping or spacing layer 24 of $Al_xGa_{1-x}As$ (x=0.3), for example. It will be appreciated that the layers 20 and 24 provide for vertical charge confinement with respect to the channel or charge transport layer 22. The mesa system (FIG. 1) also assists in defining the lateral charge confinement region. Normally, a single transport or channel layer is used in the HACT structure. An upper layer 26 of AlGaAs is subsequently grown on the spacing layer 24. This is known as a doping control layer and may be doped, for example, from about $1.5 \times 10^{17}/cm^3$ for a 900 angstrom (Å) thick layer to about $3.5 \times 10^{17}/cm^3$ for a 600 Å layer. A HACT topmost layer 28 of GaAs is grown on the doping control layer to a variable thickness of, e.g., 200 Å, which thickness may vary during formation.

Figure 4:
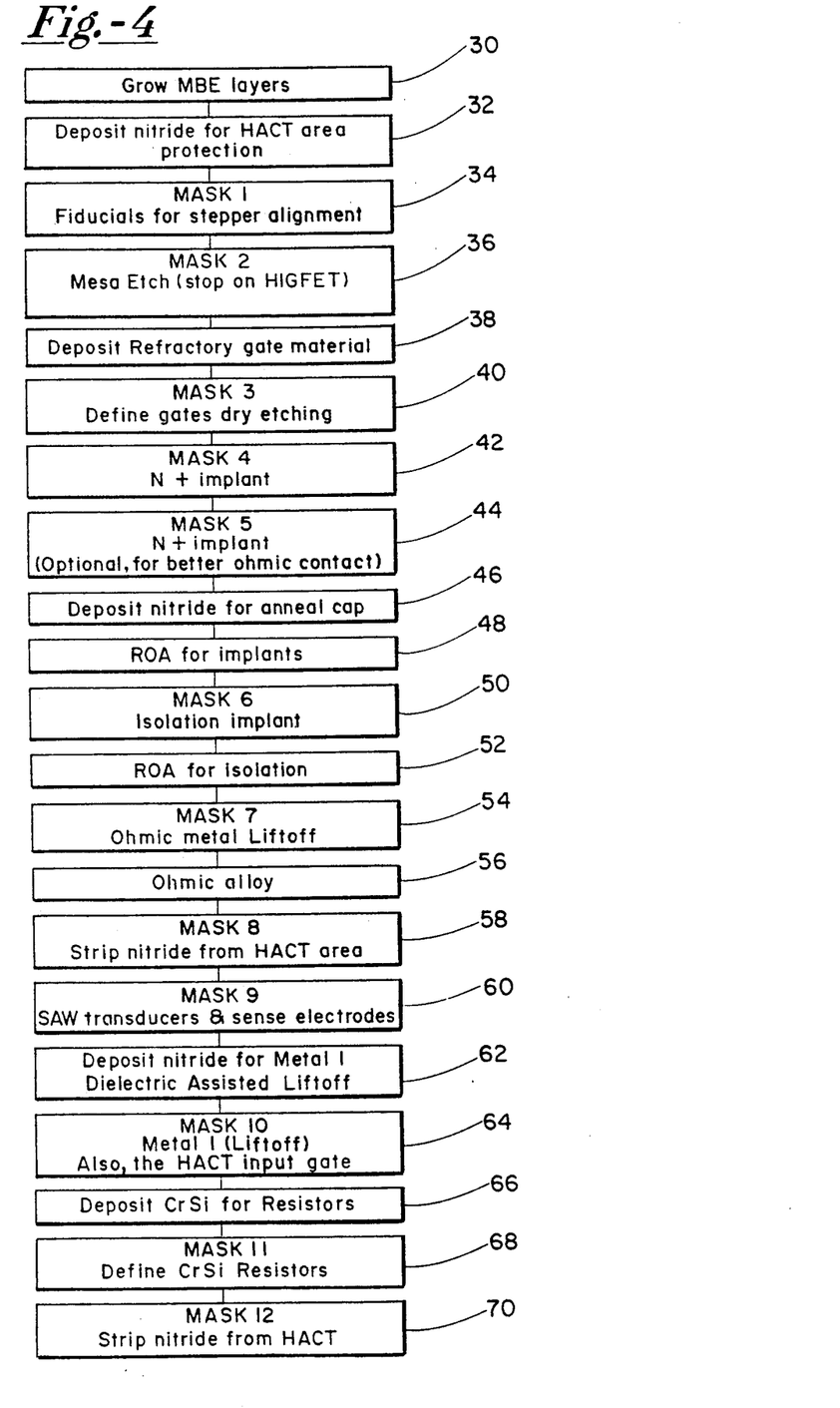
FIG. 4 is a generalized fabrication process flow chart which shows the processing steps for fabricating the device of the invention.

As illustrated in the flow chart of FIG. 4, after the complementary HIGFET and epitaxial layers and HACT layers, including the buried transport channel, have been grown on the semi-insulating GaAs wafer using MBE technique at 30, an HACT mesa is created using known area protection, masking and etching techniques. In this process, a layer of SiN, $SiO_2$, etc. is deposited on the grown MBE HACT heterostructure in step 32 to protect the HACT areas not to be etched to form the mesa from subsequent HIGFET processing. This is important inasmuch as the surface quality of the HACT area determines the quality of Schottky contact and surface control of charge depletion (Fermi level pinning) in the device.

The next step, designated 34, is typically to apply Mask 1 which is an alignment mask used to apply alignment or fiducial marks for subsequent aligning of circuit components using a mask aligner. Mask 2, the mesa etch mask, is applied next at 36. The surface is then etched using low energy active, or wet etching or a combination of such techniques. Depending on the thicknesses of the HACT layers, the etching produces an approximately 0.4 micron or less high mesa structure with adequate slopes 102 (FIG. 1) allowing for reliable metal interconnect. The etch stop layer 18 provides protection for the HIGFET layers during mesa etching.

The HIGFET processing is accomplished next. Refractory gate material such as WSi is deposited on the etched structure in step 38. This is followed by the application of Mask 3, which defines the gate pattern for the HIGFETs (95 in FIG. 1), and dry etching of the unwanted refractory material at 40. Regions on either side of each gate extending to the ohmic contact regions of the HIGFETs are then defined for N+ implant using Mask 4 at 42 and high dose ion implanted with an N+ material at 44 (Mask 5) to enhance the ohmic contact properties. Of course, no N+ implant occurs beneath the areas occupied by the gates in accordance with a self-aligning gate structure. This or a similar process is shown in greater detail in Abrokwah, et al. (U.S. Pat. No. 4,814,851) which to the extent necessary may be deemed incorporated by reference herein. A further nitride layer is applied in step 46 and an implant anneal step 48 is carried out for the implants.

A further isolation implant mask, Mask 6, is applied at 50 followed by an isolation implant and an anneal step at 52. Metallic contacts are deposited on the surface and an ohmic metal lift off is carried out in accordance with Mask 7 at 54. The ohmic contact metallized layer is typically AuGeNi based and the contacts are caused to adhere to the heavily implanted regions by conventional heat treatment at 56.

Figure 1:
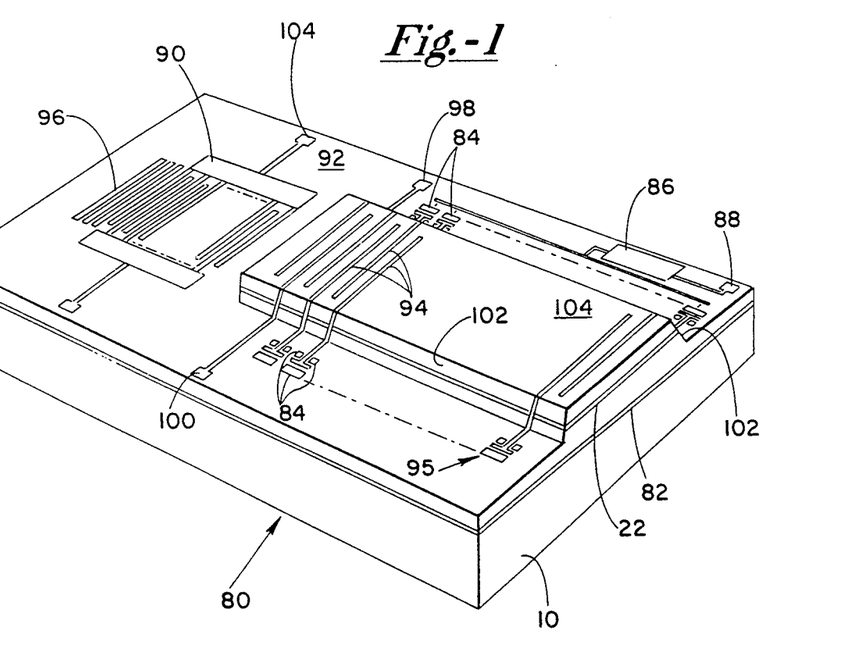
FIG. 1 is a perspective illustration of a HACT/HIGFET monolithic integrated circuit device in accordance with the invention.

Mask 8 is then applied at 58 and the nitride layer is stripped form the HACT areas on unetched mesa tops 104 (FIG. 1). Using a further mask, Mask 9, the surface acoustic wave (SAW) transducers are formed preferably below the HACT charge carrying layer using known techniques at 60 and preferably are in the form of an interdigital transducer (IDT) driver configuration, as shown at 90 in FIG. 1, on surface 92. The sense electrodes or nondestructive HACT electrodes 94 are defined; and, if the SAW reflector 96 is fabricated of a plurality of metal strips, they may also be defined. The SAW reflector 96 may also be constructed of etched grooves formed in a known manner. The SAW transducers and sense electrodes are generally fabricated of an aluminum or copper alloy. A further layer of SiN or SiO$_2$ is then deposited for metal 1 dielectric assisted liftoff according to Mask 10 at 62 and 64. The HACT analog input electrode 98 (FIG. 1) is also defined together with ground electrode 100.

The location of the SAW system at the level of the surface of the barrier layer, or surface 92, may be preferred for the illustrated embodiment of the disclosure. However, the SAW transducer system may be formed on any desired semi-insulating layer or on the semi-insulating substrate or a portion of the layered structure which has semi-insulating or low doped material beneath it in the system including, for example, on surface 104.

Other surface circuit elements desired to be integrated into the device, such as thick film resistors, or capacitors, can be incorporated into the structure. In this regard, a layer of CrSi or the like can be deposited and a further mask 11 used to define these elements at 66, 68. Finally, the second nitride or silica layer is stripped form the HACT according to Mask 12 at 70.

FIG. 1 illustrates in schematic form a HACT/HIGFET monolithic integrated circuit device fabricated in accordance with the invention. It includes a wafer substrate of semi-insulating gallium arsenide (SI GaAs) 10 on which the HIGFET complementary epitaxial layers collectively denoted as area 82 are grown by molecular beam epitaxial (MBE) techniques. The HACT transport layer is depicted by 22. The system further includes HIGFETs, the drain gate, and source of which are shown at 84, an HIGFET amplifier 86 with analog output 88. The HACT electrodes 94 are representative of a plurality of available spaced HACT electrodes or sensing taps, others of which are not shown. The SAW transducer electrical contact pads are shown at 104.

Figure 2:
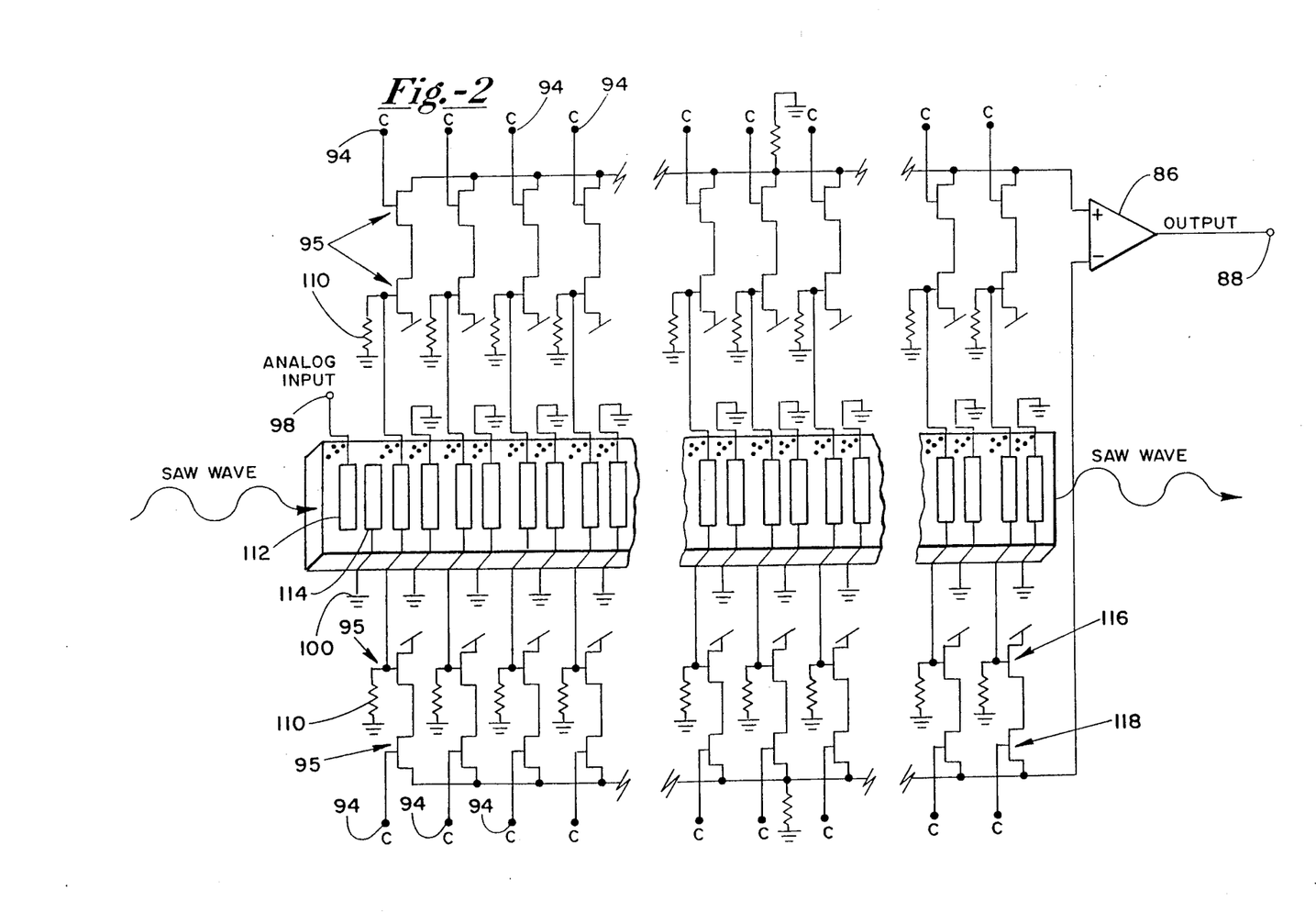
FIG. 2 is a schematic representation, with parts broken away, of a multi-tap programmable correlator and readout circuit layout which may be implemented by the device of FIG. 1.

The readout circuit layout of the system is illustrated in greater detail in FIG. 2 as a plurality of identical integrated circuit devices forming a multi-tap (possibly up to ~250 or more taps) programmable correlator for a HACT/HIGFET device in accordance with the invention. The embodiment illustrated is a symmetric layout of the circuits on both sides of the HACT mesa. The system includes bias resistors a shown at 110. The configuration includes a series of hot tap electrodes 112 alternating with grounded electrodes 114 although other tap electrode configurations can also be used. The transistors (HIGFETs) may include two discrete devices such as sensing transistors 116 and tap-weigh controlling transistors 118. They may also be constructed as a single dual gate system in accordance with construction well known in the art. Other tap weighting circuit designs may also be used. Non-uniformity of transistors can also be compensated. The connections C normally are controlled by digital to analog (D/A) devices to output control registers or the like as part of an IC.

This invention has been described in this application in considerable detail in order to comply with the Patent Statutes and to provide those skilled in the art with the information needed to apply the novel principles and to construct and use such specialized components as are required. However, it is to be further understood that the invention can be carried out by specifically different equipment and devices and that various modifications both as to equipment and procedure details can be accomplished without departing from the scope of the invention itself.

For example, the preferred embodiment or the embodiment of the detailed description is concerned with a composite layered heterostructure in which the layers of the HIGFET devices are configured first on the substrate followed by the HACT layers. The device, of course, could be fabricated with the HACT layers below the HIGFET layers if desired. However, this would be more difficult with regard to present techniques. The device of the invention is configured to readily adapt to connection with many types of electronic devices contained in a larger IC and the particular arrangement of sense taps, or other input/output devices, and the transistors shown, are merely typical of many arrangements that would occur to those skilled in the art. The connection of terminals C to digital to analog (D/A) devices and various types of registers or the like also may take a variety of forms as adapted to diverse applications.

We claim:
1. A monolithic IC device comprising:
   a semi-insulating semiconductor compound substrate having a flat major surface;
   an HIGFET heterostructure deposited on the substrate, comprising:
      a buffer layer configured on the substrate consisting essentially of undoped semiconductor;
      a channel layer configured on the buffer layer;
      a barrier layer configured on the channel layer;
      an etch stop layer configured on the barrier layer; and
   an HACT heterostructure deposited over the etch stop layer of the HIGFET heterostructure, comprising:
      a buffer layer of semiconductor configured on the etch stop layer;
      a surface acoustic wave (SAW) charge transport layer configured on the buffer layer;
      a charge confinement spacing layer configured on the channel layer;
      a doping control layer configured on the spacing layer; and
      a trimming layer configured on the doping control layer.

2. The monolithic IC device of claim 1 wherein the HIGFET channel layer consists essentially of a semiconductor material selected from the group of such materials having a desirable band structure and carrier transport properties.

3. The monolithic IC device of claim 2 wherein the HIGFET channel layer consists essentially of InGaAs.

4. The apparatus of claim 1 in which the HACT layers are carried in the form of a mesa structure on the HIGFET layers.

5. The apparatus of claim 1 wherein the heterostructure further comprises a surface acoustic wave (SAW) transducer means configured on a layer selected from the substrate, the barrier layer, buffer layer, charge confinement spacing layer, doping control layer and topmost HACT layer.

6. The apparatus of claim 4 wherein the heterostructure further comprises a surface acoustic wave (SAW) transducer means configured on a layer selected from the substrate, the barrier layer, buffer layer, charge confinement spacing layer, coping control layer and topmost HACT layer.

7. The apparatus of claim 6 wherein the HACT heterostructure further comprises a surface acoustic wave (SAW) transducer means configured on the barrier layer to propagate surface acoustic waves in the charge transport layer.

8. The apparatus of claim 5 further comprising:
   at least one analog electrical charge input device connected to the HACT charge transport layer;
   at least one signal output electrode;
   a plurality of HACT sensing taps spaced along the resistivity trimming layer and electrically connected with the HACT charge transport layer;
   a plurality of spaced integrated HIGFETs each of which is connected between an HACT sensing tap and an amplifier input of an output system.

9. The apparatus of claim 6 further comprising:
   at least one analog electrical charge input device connected to the HACT charge transport layer;
   at least one output electrode;
   a plurality of HACT output taps spaced along the resistivity trimming layer and electrically connected with the HACT charge transport layer;
   a plurality of spaced integrated HIGFETs each of which is connected between an HACT output tap and an amplifier input of an output system.

10. The apparatus of claim 7 further comprising:
    at least one analog electrical charge input device connected to the HACT charge transport layer;
    at least one output electrode;
    a plurality of HACT output taps spaced along the resistivity trimming layer and electrically connected with the HACT charge transport layer;
    a plurality of spaced integrated HIGFETs each of which is connected between an HACT output tap and an amplifier input of an output system.

11. The apparatus of claim 9 wherein the SAW further comprises electrical pads and at least one HIGFET connected between the SAW transducer electrical pads to form an oscillating feedback loop.

12. The apparatus of claim 9 further comprising a bias resistor associated with one or more of the HIGFETs.

* * * * *

UNITED STATES PATENT AND TRADEMARK OFFICE
CERTIFICATE OF CORRECTION

PATENT NO. : 5,298,772
DATED : Mar. 29, 1994
INVENTOR(S) : ANDRZEJ PECZALSKI, DAVID E. GRIDER, JAMES F. DETRY, GEORGE A. KILGORE, WILLIAM J. TANSKI, THOMAS W. DRUDKOWSKI, AND ROBERT N. SACKS.

It is certified that error appears in the above-indentified patent and that said Letters Patent is hereby corrected as shown below:

Column 7, line 16, cancel "coping" and substitute --doping--

Signed and Sealed this

Twenty-fifth Day of October, 1994

Attest:

BRUCE LEHMAN

*Attesting Officer*  *Commissioner of Patents and Trademarks*